(12) United States Patent
Lombardi et al.

(10) Patent No.: US 10,985,129 B2
(45) Date of Patent: Apr. 20, 2021

(54) MITIGATING CRACKING WITHIN INTEGRATED CIRCUIT (IC) DEVICE CARRIER

(71) Applicant: International Business Machines Corporation, Armonk, NY (US)

(72) Inventors: Thomas E. Lombardi, Poughkeepsie, NY (US); Steve Ostrander, Poughkeepsie, NY (US); Krishna R. Tunga, Wappingers Falls, NY (US); Thomas A. Wassick, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 16/384,148

(22) Filed: Apr. 15, 2019

(65) Prior Publication Data

US 2020/0328177 A1 Oct. 15, 2020

(51) Int. Cl.
*H01L 23/00* (2006.01)
*H01L 23/36* (2006.01)
*H01L 21/48* (2006.01)

(52) U.S. Cl.
CPC .......... *H01L 24/32* (2013.01); *H01L 21/4857* (2013.01); *H01L 23/36* (2013.01); *H01L 24/83* (2013.01); *H01L 2224/32225* (2013.01); *H01L 2924/1531* (2013.01)

(58) Field of Classification Search
CPC ............... H01L 23/562; H01L 21/4882; H01L 23/3672; H01L 24/83; H01L 21/561; H01L 23/36; H01L 2224/32225; H01L 2924/18161; H01L 2924/1531; H01L 21/4857; H01L 24/32
See application file for complete search history.

(56) References Cited

U.S. PATENT DOCUMENTS

| | | | |
|---|---|---|---|
| 6,528,892 B2 | 3/2003 | Caleka et al. | |
| 7,115,988 B1 | 10/2006 | Hool | |
| 7,504,718 B2 | 3/2009 | Gaynes et al. | |
| 7,635,641 B2 | 12/2009 | Hurwitz et al. | |
| 8,957,518 B2 | 2/2015 | Gregorich et al. | |
| 10,032,696 B2 | 7/2018 | Kang | |
| 2003/0197256 A1 | 10/2003 | Pommer | |
| 2006/0261469 A1* | 11/2006 | Ni | H01L 24/29 257/718 |
| 2016/0155682 A1* | 6/2016 | Ahuja | H01L 23/36 257/717 |

* cited by examiner

*Primary Examiner* — Jasmine J Clark
(74) *Attorney, Agent, or Firm* — ZIP Group PLLC

(57) ABSTRACT

Multiple integrated circuit (IC) devices are connected to a top side metallization surface of a multi IC device carrier. The carrier includes resin based substrate layers and associated wiring line layers. To reduce stain of the resin layers, especially in region(s) within the carrier between the IC devices, a stiffener or stiffeners are applied to the back side metallization (BSM) surface of the IC device carrier. The stiffener(s) reduce the amount of curvature of the IC device carrier and reduce the strain seen by the resin layer(s), thereby mitigating the risk for cracks forming and expanding within the resin layers.

20 Claims, 8 Drawing Sheets

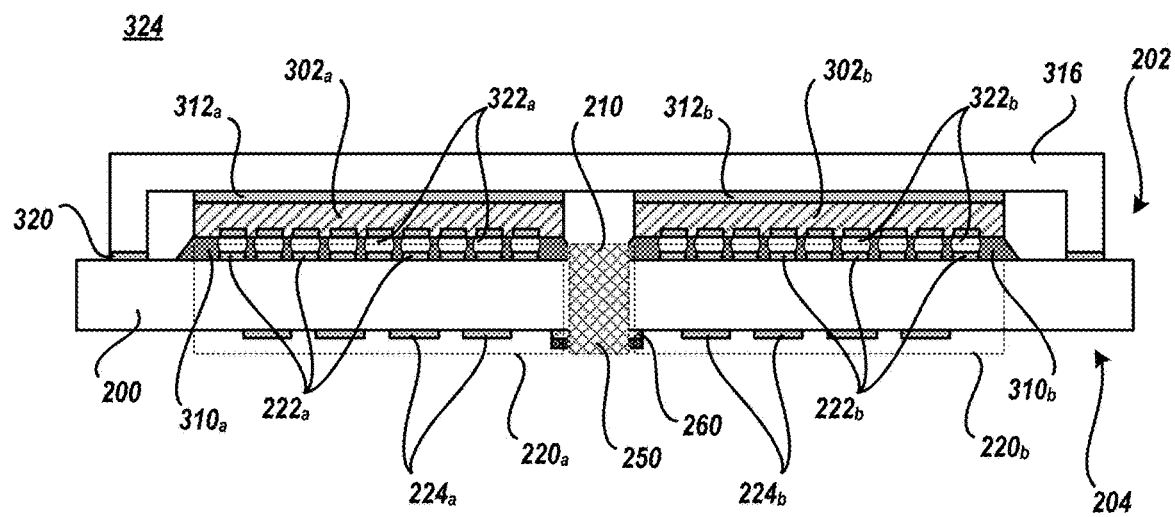
FIG. 7
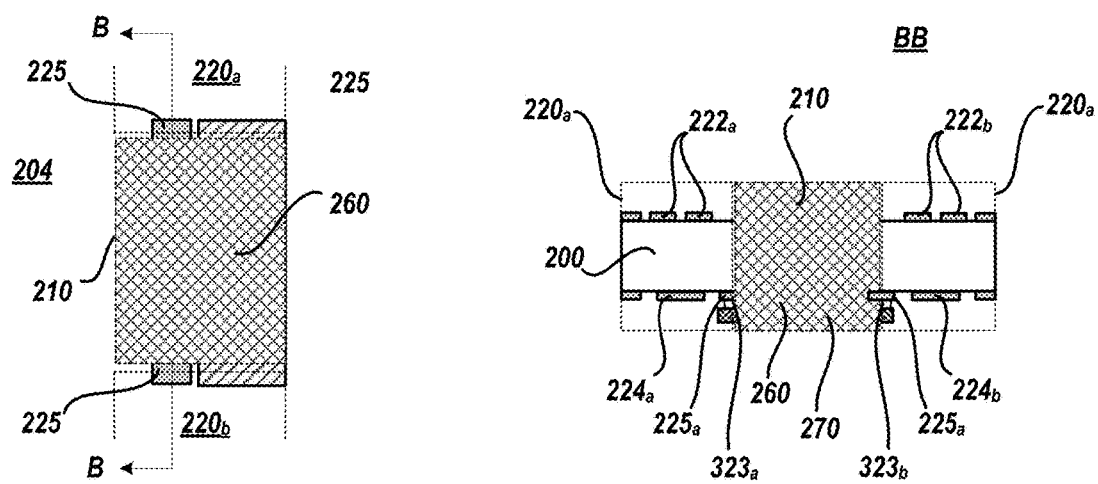
FIG. 8A
FIG. 8B

MITIGATING CRACKING WITHIN INTEGRATED CIRCUIT (IC) DEVICE CARRIER

FIELD OF THE EMBODIMENTS

Embodiments of the present invention generally relate to integrated circuit (IC) device carriers, and more particularly to mitigating cracking within the IC device carrier.

DESCRIPTION OF THE RELATED ART

Some IC device (e.g. IC chips, processors, application specific integrated circuit chips, dies, or the like) carriers have been recently fabricated with dielectric materials due to better electrical properties. However, in utilizing these materials in the fabrication of the carrier, an increased risk of material cracking during thermal cycling has been shown. The risk of cracking increases in multi IC chip carriers due to increased material strain caused by the relatively high curvature of the carrier in the region between the IC chips.

SUMMARY

In an embodiment of the present invention, a method to mitigate resin cracking within a multi IC device carrier is presented. The method includes providing a multi IC device carrier. The carrier includes a top side metallization (TSM) surface, a bottom side metallization (BSM) surface, a first IC device region underneath a first IC device through the multi IC device carrier, a second IC device region underneath a second IC device through the multi IC device carrier, an intermediary region through the multi IC device carrier between and neighboring both the first IC device region and the second IC device region, and a perimeter region through the multi IC device carrier and around a circumference of a group comprising the first IC device region, the second IC device region, and the intermediary region. The method further includes connecting a stiffener to the BSM surface. The stiffener is positioned within the intermediary region. The method further includes resisting, with the stiffener, strain internal to the multi IC device carrier.

In another embodiment of the present invention, a method to fabricate a multi IC device carrier is presented. The method includes electrically connecting a first IC device to a top side metallization (TSM) surface of the multi device carrier and electrically connecting a second IC device to the TSM surface of the multi device carrier. The multi IC device carrier includes the TSM surface, a bottom side metallization (BSM) surface, a first IC device region underneath the first IC device through the multi IC device carrier, a second IC device region underneath the second IC device through the multi IC device carrier, an intermediary region through the multi IC device carrier between and neighboring both the first IC device region and the second IC device region; and a perimeter region through the multi IC device carrier and around a circumference of a group comprising the first IC device region, the second IC device region, and the intermediary region. The method further includes connecting a stiffener to the BSM surface. The stiffener is positioned within the intermediary region.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 7 depicts a cross section view of an IC device carrier, according to one or more embodiments of the present invention.

FIG. 8A depicts a normal view of an IC device carrier back side metallization (BSM) surface, according to one or more embodiments of the present invention.

FIG. 8B depicts a cross section view of an IC device carrier, according to one or more embodiments of the present invention.

DETAILED DESCRIPTION

An multi IC device carrier includes resin based substrate layers and wiring line layers thereupon, respectively. To reduce stain of the resin layers, especially in the region(s) of the carrier between the IC devices, a stiffener or stiffeners are applied to the back side metallization (BSM) surface of the IC device carrier. The stiffener(s) locally reduce the amount of curvature of the IC device carrier and reduce the strain seen by the resin layer(s), thereby mitigating the risk for cracks forming and expanding within the resin layers.

Figure 1:
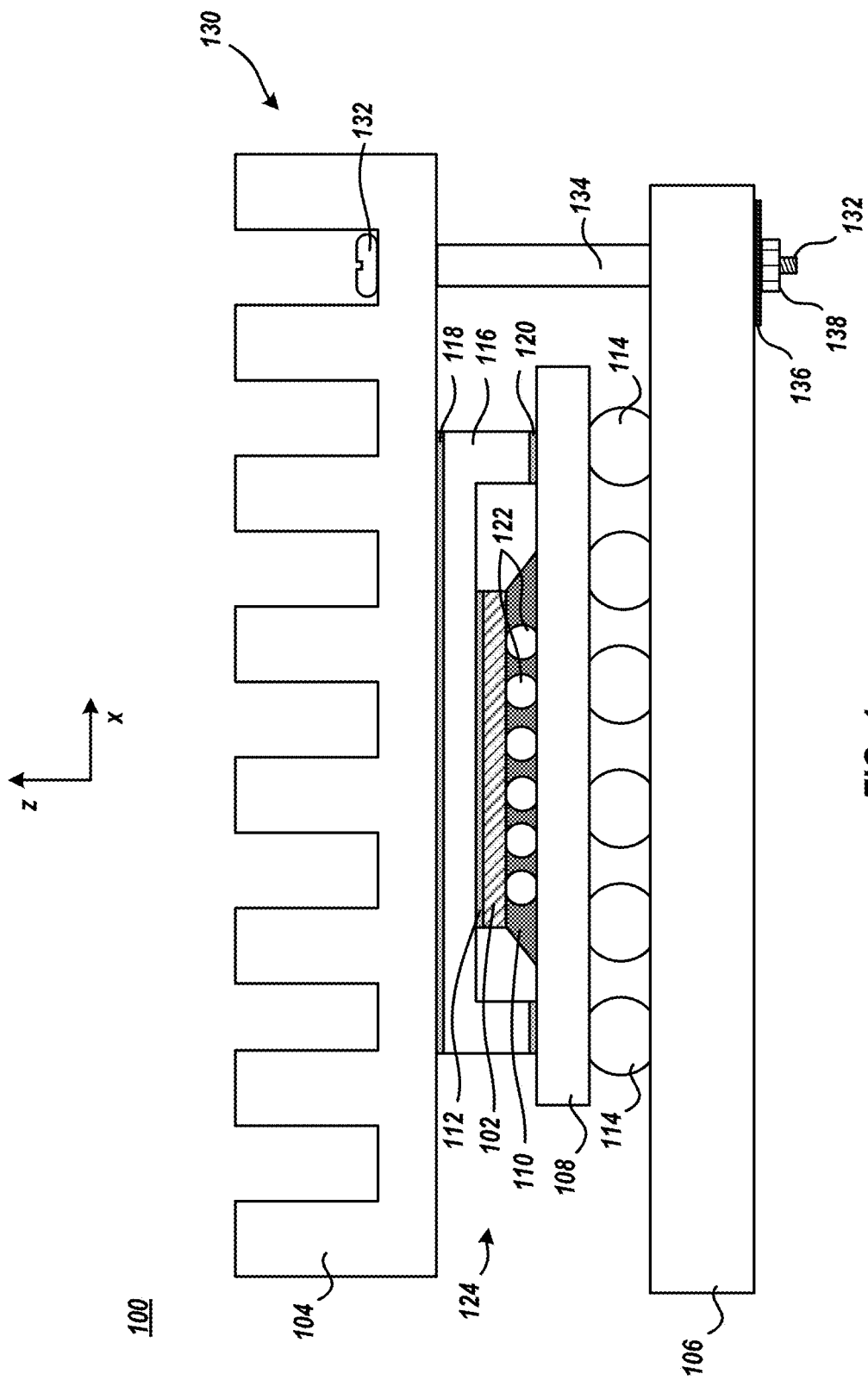
FIG. 1 depicts a prior art electronic system.

FIG. 1 depicts a prior art electronic system 100. Electronic system 100 may be for example a computer, server, mobile device, tablet, kiosk, infotainment system, and the like. System 100 includes an IC chip module or package 124 that includes a chip 102, carrier 108, interconnects 122, underfill 110, thermal interface material 112, lid 116, and adhesive 120.

Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, land grid array (LGA) of complaint pins, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heat sink 104 may be thermally joined to package 124 via thermal interface material 118. Heat sink 104 is a passive heat exchanger that cools chip 102 by dissipating heat into the surrounding air. As such, during operation of electronic device 100, a thermal path may exist from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2:
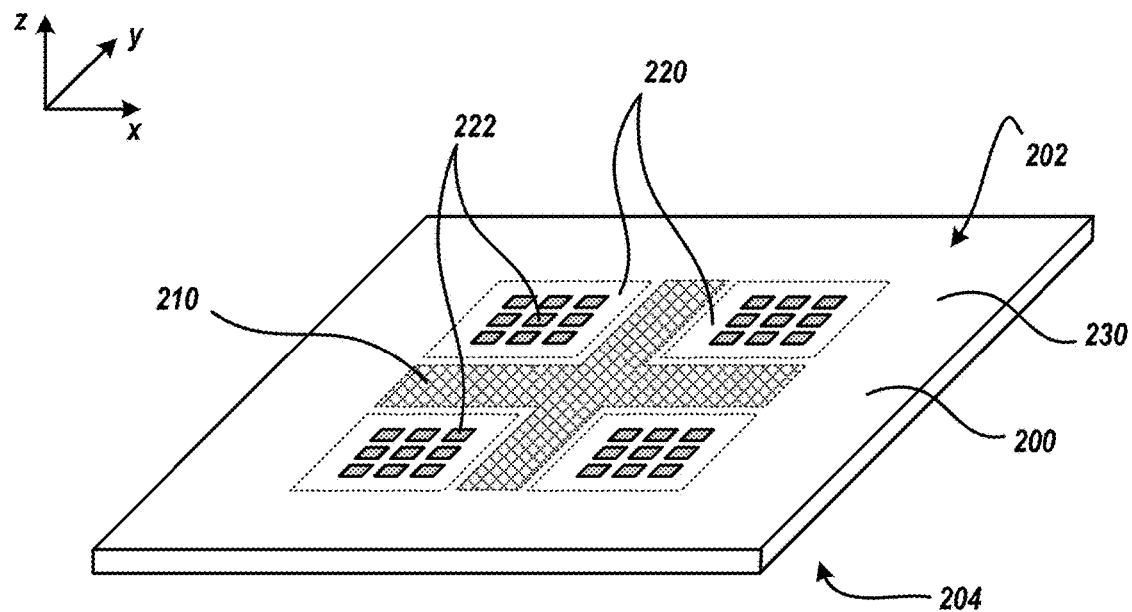
FIG. 2 depicts an isometric view of an IC device carrier, according to one or more embodiments of the present invention.
Figure 3:
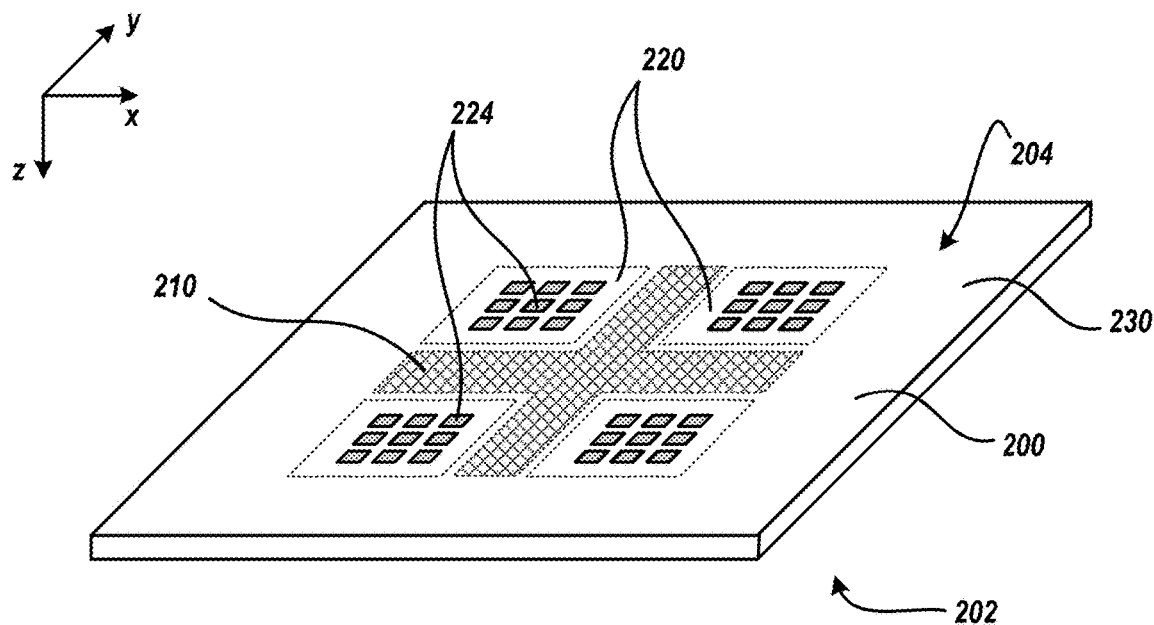
FIG. 3 depicts an isometric view of an IC device carrier, according to one or more embodiments of the present invention.

FIG. 2 and FIG. 3 depict isometric views of an IC device carrier 200. FIG. 2 depicts a top side metallization (TSM) surface 202 and FIG. 3 depicts an opposing bottom side metallization (BSM) surface 204 of the carrier 200.

Carrier 200 is an organic carrier and may be fabricated by known fabrication techniques, such as forming dielectric substrate layers upon a core, forming metal wiring lines upon the dielectric substrate layers, or the like. According to various embodiments of the present invention, the dielectric substrate layers may be resin based layers, resin impregnated layers, or the like which are subsequently referred to herein as resin layers.

Carrier 200 provides mechanical support for multiple IC devices (e.g., IC chips, processors, co-processors, application specific integrated circuit chips, field programmable gate arrays, dies, or the like). As such, carrier 200 includes multiple IC device regions 220. Each region 220 may be a projection or footprint of the perimeter of the associated IC device through the IC device carrier 200. One or more intermediary regions 210 exist between different IC device regions 220 through the IC device carrier 200. A perimeter region 230 may exist around the circumference or perimeter of a group consisting of all the IC device regions 220 and all the intermediary regions 210 through the IC device carrier 200.

Increased strain levels in region 210 is caused by the relatively small spacing between the IC devices. When the spacing between the IC devices is small (e.g., less than 3 mm, etc.), there may not be enough space for supporting or stiffening structures on the TSM surface 202 between the IC devices. This causes a high rate of curvature between the IC devices, in region 210, thereby increasing the strain level of the laminate material in this region 210. The strain on the laminate material is especially high near the BSM surface 204 of region 210.

Electrically conductive contacts 222 may exist within each IC device region 220 upon the TSM surface 202. The contacts 222 may be positioned upon the TSM surface 202 in the IC device region 220 in an array, such as columns and rows as depicted. Similarly, electrically conductive contacts 224 may exist within each IC device region 220 upon the BSM surface 204. The contacts 224 may also be positioned upon the BSM surface 204 in the IC device region 220 in an array. The contacts 224 may have a larger contact pad surface area relative to the contact pad surface area of contacts 222. One or more conductive wiring lines fabricated within the carrier 200 may be connected to a contact 222 and to a contact 224 within the same IC device region 220, as is known in the art. Such features provide electrical paths from the TSM surface 202 of carrier 200 to the opposing BSM surface 204 of carrier 200. Contacts 222 are configured to be in electrical communication with an associated IC device (e.g. IC chip, etc.) contact and contacts 224 are configured to be in electrical communication with a higher level data handling system contact, such as a system board contact, motherboard contact, or the like. Contact(s) 224 on the BSM surface 204 may be in a relatively different x-y location as contact (s) 222 on the TSM surface 202.

Figure 4A:
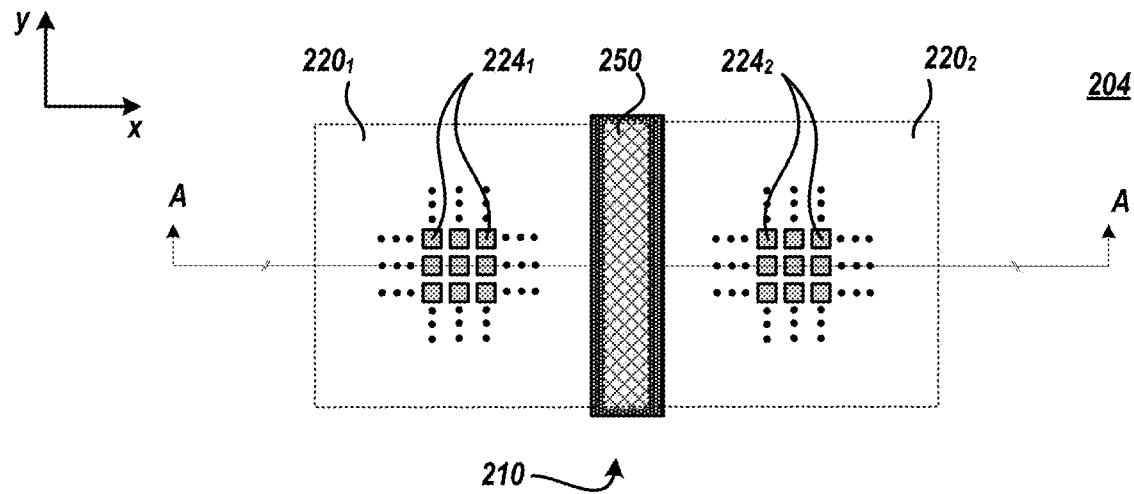
FIG. 4A depicts a normal view of an IC device carrier back side metallization (BSM) surface, according to one or more embodiments of the present invention.

FIG. 4A depicts a normal view of an exemplary IC device carrier 200 BSM surface 204 when carrier 200 is configured as a two IC device carrier. In the present example, IC device carrier 200 includes an IC device region $220_1$ and an IC device region $220_2$. IC device region 210 separates and is between IC device region $220_1$ and IC device region $220_2$. One or more y-axis boundaries of IC device region 210 may be coplanar with the one or more adjacent respective y-axis boundary of IC device region $220_1$ or IC device region $220_2$.

Contacts $222_1$ (not shown) and contacts $224_1$ are within IC device region $220_1$. Contacts $222_2$ (not shown) and contacts $224_2$ are within IC device region $220_2$.

A stiffener 250 is applied, formed, bonded, connected, or otherwise attached to the BSM surface 204 at least within IC device region 210. Stiffener 250 is formed of a material with sufficient rigidity or stiffness to locally resist resin layer(s) curvature within at least IC device region 210. Stiffener 250 may be formed of a material that has the same or substantially similar (i.e. plus or minus an acceptable fabrication or system tolerance known in the art) coefficient of thermal expansion (CTE) relative to the carrier 200. In some embodiments, the stiffener 250 may be a metal bar, or the like. For example, the stiffener 250 may be a steel bar with a x-dimension of 2 millimeters, a z-dimension of 0.5 millimeters, and a y-dimension of 10 millimeters. Stiffener 250 may be connected to carrier 200 by an adhesive 260, shown e.g., in FIG. 7. Stiffener 250 adds rigidity or stiffness to IC device region(s) 210 to effectively resist local strain forces that would otherwise be exerted upon the resin layer(s) material within the carrier 200. As such, stiffener 250 mitigates the risks of cracking and/or crack propagation within the resin layer(s) in IC device region(s) 210.

In one example, the stiffener 250 dimensions are configured such that stiffener 250 lays entirely within the IC device region 210. In another example, the stiffener 250 dimensions are configured such that stiffener 250 lays within the IC device region 210 and extends in one or more x-axis directions into IC device region $220_1$ and/or into IC device region $220_2$. In another example depicted in FIG. 4A, the stiffener 250 dimensions are configured such that stiffener 250 lays within the IC device region 210, extends in one or more x-axis directions into IC device region $220_1$ and/or into IC device region $220_2$, and extends in one or more y-axis directions past the boundary of IC device region 210.

Figure 4B:
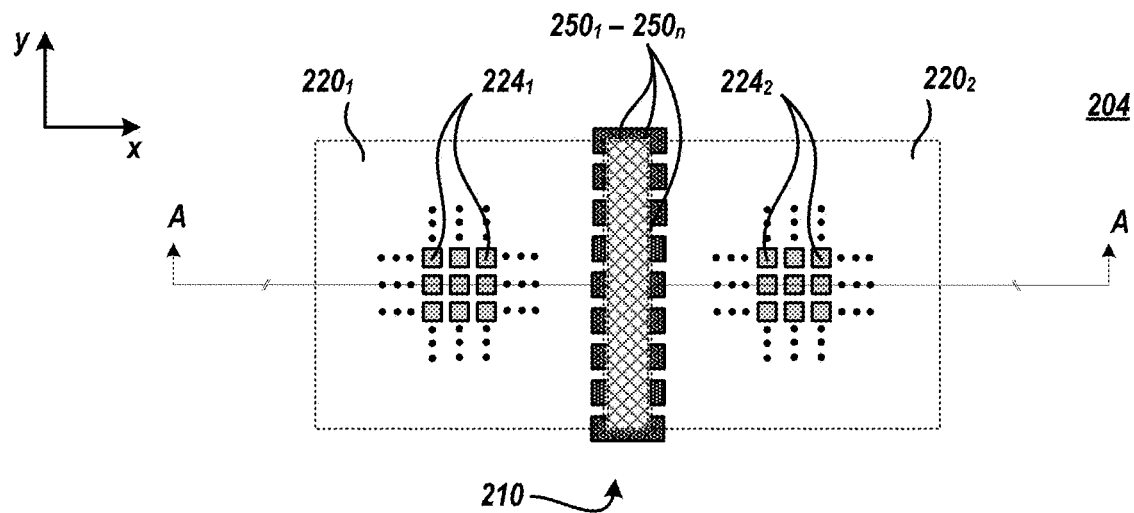
FIG. 4B depicts a normal view of an IC device carrier back side metallization (BSM) surface, according to one or more embodiments of the present invention.

FIG. 4B depicts a normal view of an exemplary IC device carrier 200 BSM surface 204 when carrier 200 is configured as a two IC device carrier. In the present example, IC device carrier 200 includes an IC device region $220_1$ and an IC device region $220_2$. IC device region 210 separates and is between IC device region $220_1$ and IC device region $220_2$. One or more y-axis boundaries of IC device region 210 may be coplanar with the one or more adjacent respective y-axis boundary of IC device region $220_1$ or IC device region $220_2$. Contacts $222_1$ (not shown) and contacts $224_1$ are within IC device region $220_1$. Contacts $222_2$ (not shown) and contacts $224_2$ are within IC device region $220_2$.

Multiple stiffeners $250_1$-$250_n$ are applied, formed, bonded, connected, or otherwise attached to the BSM surface 204 at least within IC device region 210. Stiffeners $250_1$-$250_n$ are formed of a material with sufficient rigidity or stiffness to locally resist resin layer(s) curvature within at least IC device region 210. Stiffeners $250_1$-$250_n$ may be formed of the same or different materials that have the same or substantially similar (i.e. plus or minus an acceptable fabrication or system tolerance known in the art) coefficient of thermal expansion (CTE) relative to the carrier 200. In some embodiments, the stiffeners $250_1$-$250_n$ may all be metal bars, or the like. For example, each stiffener $250_1$-$250_n$ may be a steel bar with a x-dimension of 2 millimeters, a z-dimension of 0.5 millimeters, and a y-dimension of 1.5 millimeters. There may be e.g., a 0.5 mm gap between each stiffener $250_1$-$250_n$. Each stiffener $250_1$-$250_n$ may be connected to carrier 200 by an adhesive 260, shown e.g., in FIG. 7. Each stiffener $250_1$-$250_n$ adds rigidity or stiffness to IC device region(s) 210 to effectively resist local strain forces that would otherwise be exerted upon the resin layer(s) material within the carrier 200. As such, the series of stiffeners $250_1$-$250_n$ mitigates the risks of cracking and/or crack propagation within the resin layer(s) in IC device region(s) 210.

In one example, each stiffener $250_1$-$250_n$ dimensions are configured such that each stiffener $250_1$-$250_n$ lays entirely within the IC device region 210. In another example, each stiffener $250_1$-$250_n$ dimensions are configured such that each stiffener $250_1$-$250_n$ lays within the IC device region 210 and extends in one or more x-axis directions into IC device region $220_1$ and/or into IC device region $220_2$. In another example depicted in FIG. 4B, each stiffener $250_1$-$250_n$ dimensions are configured such that each stiffener $250_2$-$250_{(n)}$ lays within the IC device region 210 and extends in one or more x-axis directions into IC device region $220_1$ and/or into IC device region $220_2$ and are further configured such that stiffener $250_1$ and $250_n$ lays within the IC device region 210 and extends in one or more x-axis directions into IC device region $220_1$ and/or into IC device region $220_2$ and extends in one or more y-axis directions past the boundary of IC device region 210, respectively.

In the configuration with multiple stiffeners $250_1$-$250_n$ between regions 220, a larger reduction of resign cracking strain of the resin locally near the BSM surface 204 within region 210 may be achieved. Generally, the stiffeners described herein affects the strains within the carrier 200 in at least two ways. First, the stiffener(s) decreases the strain level by decreasing the carrier 200 curvature. Second, the stiffener(s) increases the strain level if there is any CTE mismatch between the stiffener(s) and the carrier 200. The increase in strain caused by CTE mismatch is proportional to the length of the stiffener. A single long stiffener, shown for example in FIG. 4A, is more effective than blocks of small stiffeners, shown for example in FIG. 4B, when there is no CTE mismatch between the single long stiffener and the carrier 200. If there is a CTE mismatch between the single long stiffener and the carrier 200, strains within the carrier 200 are increased. This effect is larger as the length of the stiffener is increased. Therefore, a larger reduction of resign cracking strain of the resin locally near the BSM surface 204 within region 210 may be achieved with blocks of small stiffeners when the CTE of the stiffener(s) does not match the CTE of the carrier 200.

Figure 5A:
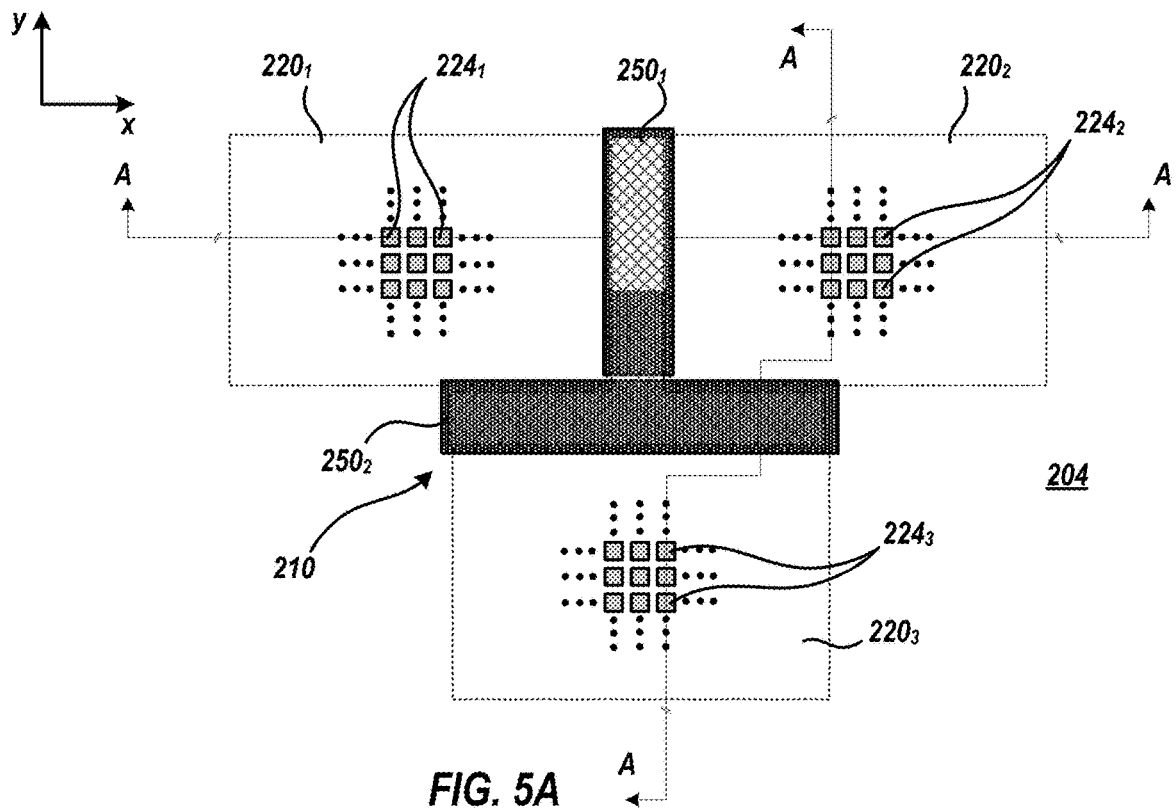
FIG. 5A depicts a normal view of an IC device carrier back side metallization (BSM) surface, according to one or more embodiments of the present invention.

FIG. 5A depicts a normal view of an exemplary IC device carrier 200 BSM surface 204 when carrier 200 is configured as a three IC device carrier. In the present example, IC device carrier 200 includes an IC device region $220_1$, an IC device region $220_2$, and an IC device region $220_3$. IC device region 210 separates and is between IC device region $220_1$ and IC device region $220_2$. Further, IC device region 210 separates and is between IC device region $220_1$ and IC device region $220_3$ and separates and is between IC device region $220_2$ and IC device region $220_3$.

As depicted, the x-axis boundary of IC device region 210 with the largest y-value may be coplanar the x-axis boundaries of the adjacent IC device region $220_1$ and/or IC device region $220_2$. Likewise, the x-axis boundary of IC device region 210 with the smallest y-value may be coplanar with the x-axis boundary of the adjacent IC device region $220_3$. Similarly, the y-axis boundary of IC device region 210 with the smallest x-value may be coplanar with the boundary of the adjacent IC device region $220_3$ (as shown) or may be coplanar with the boundary of the adjacent IC device region $220_1$. Likewise, the y-axis boundary of IC device region 210 with the largest x-value may be coplanar with the boundary of the adjacent IC device region $220_3$ (as shown) or may be coplanar with the boundary of the adjacent IC device region $220_2$.

Contacts $222_1$ (not shown) and contacts $224_1$ are within IC device region $220_1$. Contacts $222_2$ (not shown) and contacts $224_2$ are within IC device region $220_2$. Contacts $222_3$ (not shown) and contacts $224_3$ are within IC device region $220_3$.

A stiffener $250_1$ and stiffener $250_2$ are applied, formed, bonded, connected, or otherwise attached to the BSM surface 204 at least within IC device region 210. Stiffener $250_1$ and stiffener $250_2$ are formed of a material with sufficient rigidity or stiffness to locally resist resin layer(s) curvature within at least IC device region 210. Stiffener $250_1$ and stiffener $250_2$ may be formed of the same or different materials that have the same or substantially similar CTE (i.e. the same CTE plus or minus a typical tolerance as known in the art) relative to the carrier 200. In some embodiments, stiffener $250_1$ and stiffener $250_2$ may be metal bars, or the like.

Stiffener $250_1$ is generally between or associated with IC device region $220_1$ and IC device region $220_2$. As an example, stiffener $250_1$ may be a steel bar with a x-dimension of 2 millimeters, a z-dimension of 0.5 millimeters, and a y-dimension of 10 millimeters. Stiffener $250_2$ is generally between or associated with IC device region $220_{1\ and/or\ 2}$ and IC device region $220_3$ and as an example, may be steel bar with a y-dimension of 2 millimeters, a z-dimension of 0.5 millimeters, and a x-dimension of 12 millimeters. There may be e.g., a 0.5 mm gap between each stiffener $250_1$ and stiffener $250_2$.

Stiffener $250_1$ and stiffener $250_2$ may be connected to carrier 200 by an adhesive 260, shown e.g., in FIG. 7. Stiffener $250_1$ and stiffener $250_2$ adds rigidity or stiffness to IC device region 210 to effectively resist local strain forces that would otherwise be exerted upon the resin layer(s) material in IC device region 210 within the carrier 200. As such, stiffener $250_1$ and stiffener $250_2$ mitigates the risks of cracking and/or crack propagation within the resin layer(s) in IC device region(s) 210.

In one example, stiffener $250_1$ and stiffener $250_2$ dimensions are configured so that stiffener $250_1$ and stiffener $250_2$ lays entirely within the IC device region 210. In another example, stiffener $250_1$ and stiffener $250_2$ dimensions are configured such that stiffener $250_1$ and stiffener $250_2$ lays within the IC device region 210 and extends into one or both adjacent IC device regions 220. In another example, the stiffeners nearest the x-axis and/or y-axis boundaries of IC device region 210 lays within the IC device region 210 and extends beyond the x-axis and/or y-axis boundaries of IC device region 210, respectively (i.e., stiffener $250_1$ extends beyond the x-axis boundary nearest the top of the page of IC device region 210, stiffener $250_2$ extends beyond the y-axis boundary nearest the left side of the page of IC device region 210 and extends beyond the y-axis boundary nearest the right side of the page of IC device region 210.

Figure 5B:
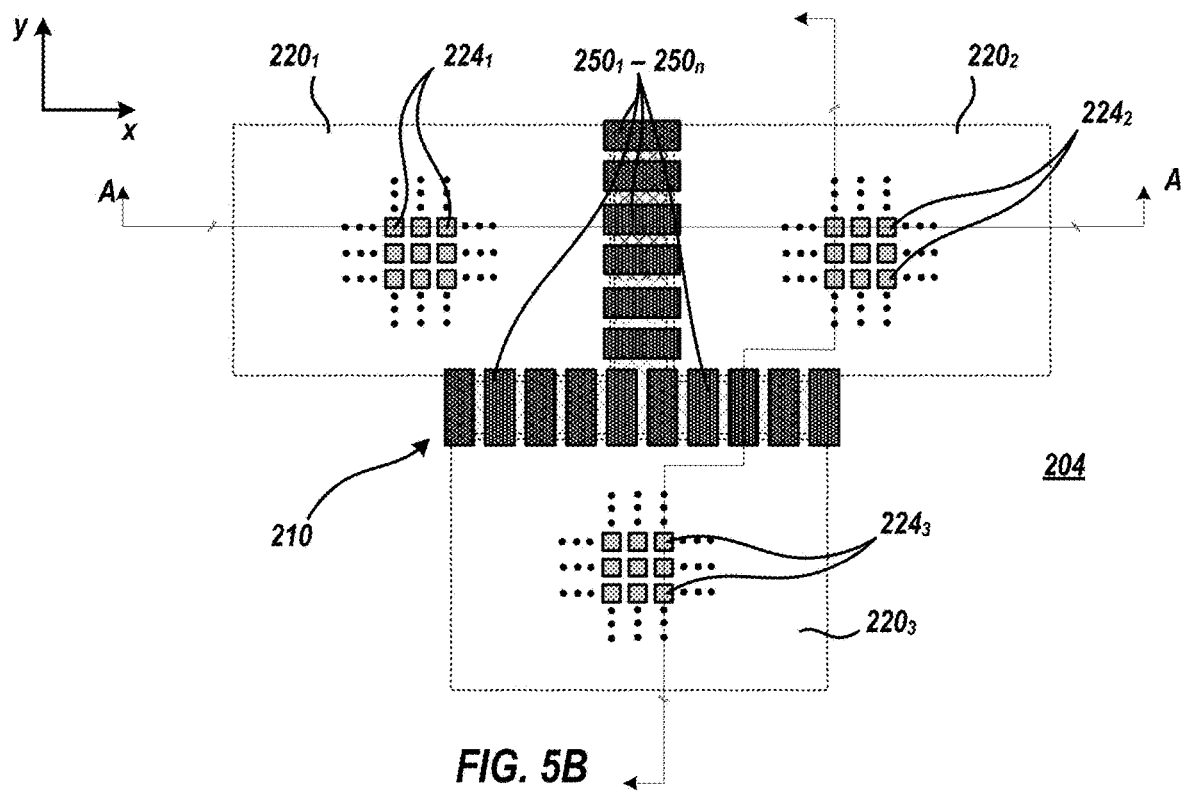
FIG. 5B depicts a normal view of an IC device carrier back side metallization (BSM) surface, according to one or more embodiments of the present invention.

FIG. 5B depicts a normal view of an exemplary IC device carrier 200 BSM surface 204 when carrier 200 is configured as a three IC device carrier. In the present example, IC device carrier 200 includes an IC device region $220_1$, an IC device region $220_2$, and an IC device region $220_3$. IC device region 210 separates and is between IC device region $220_1$ and IC device region $220_2$. Further, IC device region 210 separates and is between IC device region $220_1$ and IC device region $220_3$ and separates and is between IC device region $220_2$ and IC device region $220_3$.

As depicted, the x-axis boundary of IC device region 210 with the largest y-value may be coplanar the x-axis boundaries of the adjacent IC device region $220_1$ and/or IC device region $220_2$. Likewise, the x-axis boundary of IC device region 210 with the smallest y-value may be coplanar with the x-axis boundary of the adjacent IC device region $220_3$. Similarly, the y-axis boundary of IC device region 210 with the smallest x-value may be coplanar with the boundary of the adjacent IC device region $220_3$ (as shown) or may be coplanar with the boundary of the adjacent IC device region $220_1$. Likewise, the y-axis boundary of IC device region 210 with the largest x-value may be coplanar with the boundary of the adjacent IC device region $220_3$ (as shown) or may be coplanar with the boundary of the adjacent IC device region $220_2$.

Contacts $222_1$ (not shown) and contacts $224_1$ are within IC device region $220_1$. Contacts $222_2$ (not shown) and contacts $224_2$ are within IC device region $220_2$. Contacts $222_3$ (not shown) and contacts $224_3$ are within IC device region $220_3$.

Multiple stiffeners $250_1$-$250_n$ are applied, formed, bonded, connected, or otherwise attached to the BSM surface 204 at least within IC device region 210. Stiffeners $250_1$-$250_n$ are formed of a material with sufficient rigidity or stiffness to locally resist resin layer(s) curvature within at least IC device region 210. Stiffeners $250_1$-$250_n$ may be formed of the same or different materials that have the same or substantially similar CTE relative to the carrier 200. In some embodiments, the stiffeners $250_1$-$250_n$ may all be metal bars, or the like.

A series of stiffeners generally between or associated with IC device region $220_1$ and IC device region $220_2$ may be, for example, steel bars with a x-dimension of 2 millimeters, a z-dimension of 0.5 millimeters, and a y-dimension of 1.5 millimeters. Another series of stiffeners generally between or associated with IC device region $220_1$ ore and IC device region $220_3$ may be, for example, steel bars with a y-dimension of 2 millimeters, a z-dimension of 0.5 millimeters, and a x-dimension of 1.5 millimeters. There may be e.g., a 0.5 mm gap between each stiffener $250_1$-$250_n$.

Each stiffener $250_1$-$250_n$ may be connected to carrier 200 by an adhesive 260, shown e.g., in FIG. 7. Each stiffener $250_1$-$250_n$ adds rigidity or stiffness to IC device region 210 to effectively resist local strain forces that would otherwise be exerted upon the resin layer(s) material in IC device region 210 within the carrier 200. As such, the stiffeners $250_1$-$250_n$ mitigates the risks of cracking and/or crack propagation within the resin layer(s) in IC device region(s) 210.

In one example, each stiffener $250_1$-$250_n$ dimensions are configured so that each stiffener $250_1$-$250_n$ lays entirely within the IC device region 210. In another example, each stiffener $250_1$-$250_n$ dimensions are configured such that each stiffener $250_1$-$250_n$ lays within the IC device region 210 and extends into one or both adjacent IC device regions 220. In another example, the stiffeners 250 nearest the x-axis and/or y-axis boundaries of IC device region 210 lays within the IC device region 210 and extends beyond the x-axis and/or y-axis boundaries of IC device region 210, respectively (i.e., the stiffener nearest the left side of the page lays within the IC device region 210 and extends beyond the left y-axis boundary of IC device region 210, the stiffener nearest the right side of the page lays within the IC device region 210 and extends beyond the right y-axis boundary of IC device region 210, and the stiffener nearest the top side of the page lays within the IC device region 210 and extends beyond the x-axis boundary nearest to the top of the page of IC device region 210.

Figure 6A:
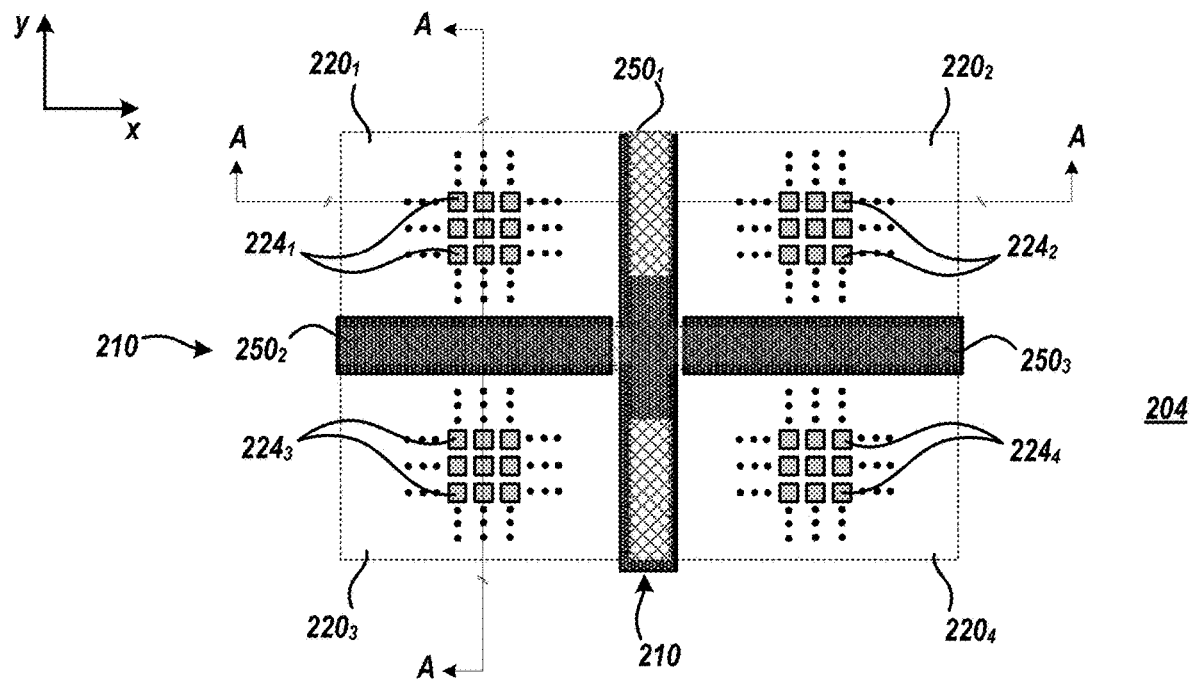
FIG. 6A depicts a normal view of an IC device carrier back side metallization (BSM) surface, according to one or more embodiments of the present invention.

FIG. 6A depicts a normal view of an exemplary IC device carrier 200 BSM surface 204 when carrier 200 is configured as a four IC device carrier. In the present example, IC device carrier 200 includes an IC device region $220_1$, an IC device region $220_2$, an IC device region $220_3$, and an IC device region $220_4$. IC device region 210 separates and is between each IC device region $220_1$, IC device region $220_2$, IC device region $220_3$, and an IC device region $220_4$.

As depicted, the x-axis boundary of IC device region 210 with the largest y-value may be coplanar the x-axis boundaries of the adjacent IC device region $220_1$ and/or IC device region $220_2$. Likewise, the x-axis boundary of IC device region 210 with the smallest y-value may be coplanar with the x-axis boundaries of the adjacent IC device region $220_3$ and/or IC device region $220_4$. Similarly, the y-axis boundary of IC device region 210 with the smallest x-value may be coplanar with the boundary of the adjacent IC device region $220_3$ and/or may be coplanar with the boundary of the adjacent IC device region $220_1$. Likewise, the y-axis boundary of IC device region 210 with the largest x-value may be coplanar with the boundary of the adjacent IC device region $220_2$ and/or may be coplanar with the boundary of the adjacent IC device region $220_4$.

Contacts $222_1$ (not shown) and contacts $224_1$ are within IC device region $220_1$. Contacts $222_2$ (not shown) and contacts $224_2$ are within IC device region $220_2$. Contacts $222_3$ (not shown) and contacts $224_3$ are within IC device region $220_3$. Contacts $222_4$ (not shown) and contacts $224_4$ are within IC device region $220_4$.

A stiffener $250_1$, stiffener $250_2$, and stiffener $250_3$ are applied, formed, bonded, connected, or otherwise attached to the BSM surface 204 at least within IC device region 210. Stiffener $250_1$, stiffener $250_2$, and stiffener $250_3$ are formed of a material with sufficient rigidity or stiffness to locally resist resin layer(s) curvature within at least IC device region 210. Stiffener $250_1$, stiffener $250_2$, and stiffener $250_3$ may be formed of the same or different materials that have the same or substantially similar CTE relative to the carrier 200. In some embodiments, substantially similar CTE may be metal bars, or the like.

Stiffener $250_1$ is generally between or associated with IC device region $220_1$ and IC device region $220_2$ and is further generally between or associated with IC device region $220_3$ and IC device region $220_4$. Stiffener $250_2$ is generally between or associated with IC device region $220_1$ and IC device region $220_3$. Stiffener $250_3$ is generally between or associated with IC device region $220_3$ and IC device region $220_4$.

Stiffener $250_1$ may be, for example, a steel bar with a x-dimension of 2 millimeters, a z-dimension of 0.5 millimeters, and a y-dimension of 10 millimeters. Stiffener $250_2$ and stiffener $250_3$ may be, for example, a steel bar with a y-dimension of 2 millimeters, a z-dimension of 0.5 millimeters, and a x-dimension of 5 millimeters. There may be e.g., a 0.5 mm gap between stiffener $250_1$ and stiffener $250_2$ and between stiffener $250_1$ and stiffener $250_3$.

Stiffener $250_1$, stiffener $250_2$, and stiffener $250_3$ may be connected to carrier 200 by an adhesive 260, shown e.g., in FIG. 7. Stiffener $250_1$, stiffener $250_2$, and stiffener $250_3$ adds rigidity or stiffness to IC device region 210 to effectively resist local strain forces that would otherwise be exerted upon the resin layer(s) material in IC device region 210 within the carrier 200. As such, stiffener $250_1$, stiffener $250_2$, and stiffener $250_3$ mitigates the risks of cracking and/or crack propagation within the resin layer(s) in IC device region(s) 210.

In one example, stiffener $250_1$, stiffener $250_2$, and stiffener $250_3$ dimensions are configured so that stiffener $250_1$, stiffener $250_2$, and stiffener $250_3$ lays entirely within the IC device region 210. In another example, Stiffener $250_1$, stiffener $250_2$, and stiffener $250_3$ dimensions are configured such that Stiffener $250_1$, stiffener $250_2$, and stiffener $250_3$ lays within the IC device region 210 and extends into one or both adjacent IC device regions 220. In another example, the stiffeners nearest the x-axis and/or y-axis boundaries of IC device region 210 lays within the IC device region 210 and extends beyond the x-axis and/or y-axis boundaries of IC device region 210, respectively (i.e., stiffener $250_1$ extends beyond the x-axis boundary nearest the top of the page and the x-axis boundary nearest the bottom of the page of IC device region 210, stiffener $250_2$ extends beyond the y-axis boundary nearest the left side of the page of IC device region 210, and stiffener $250_3$ extends beyond the y-axis boundary nearest the right side of the page of IC device region 210.

Figure 6B:
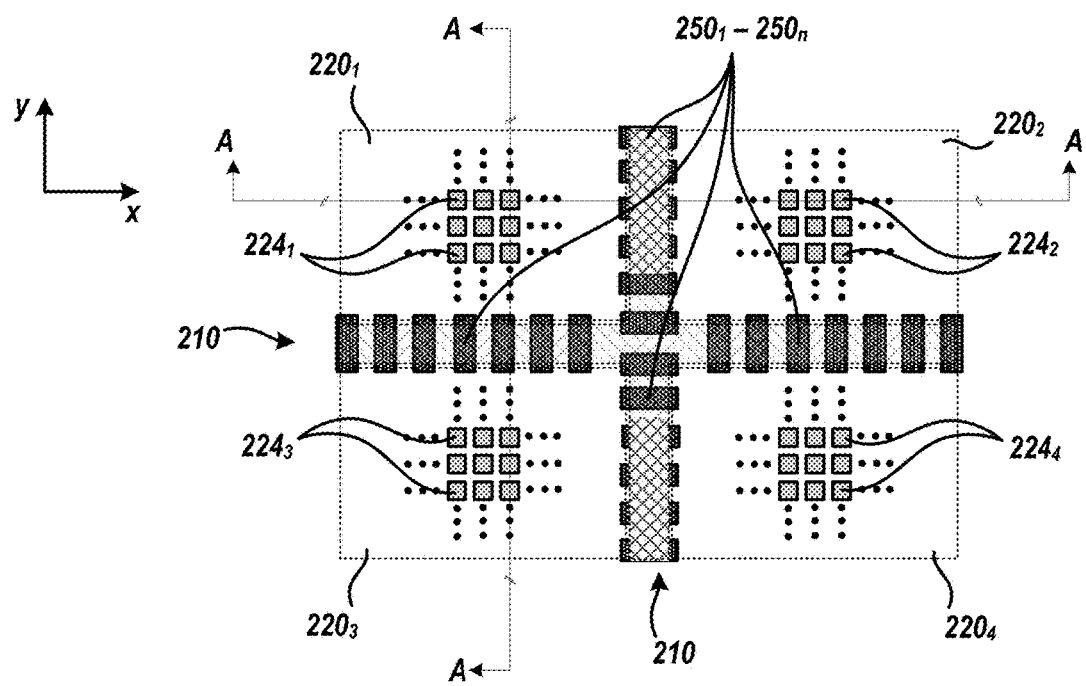
FIG. 6B depicts a normal view of an IC device carrier back side metallization (BSM) surface, according to one or more embodiments of the present invention.

FIG. 6B depicts a normal view of an exemplary IC device carrier 200 BSM surface 204 when carrier 200 is configured as a four IC device carrier. In the present example, IC device carrier 200 includes an IC device region $220_1$, an IC device region $220_2$, an IC device region $220_3$, and an IC device region $220_4$. IC device region 210 separates and is between each IC device region $220_1$, IC device region $220_2$, IC device region $220_3$, and IC device region $220_4$.

As depicted, the x-axis boundary of IC device region 210 with the largest y-value may be coplanar the x-axis boundaries of the adjacent IC device region $220_1$ and/or IC device region $220_2$. Likewise, the x-axis boundary of IC device region 210 with the smallest y-value may be coplanar with the x-axis boundary of the adjacent IC device region $220_3$ and/or IC device region $220_4$. Similarly, the y-axis boundary of IC device region 210 with the smallest x-value may be coplanar with the boundary of the adjacent IC device region $220_3$ and/or may be coplanar with the boundary of the adjacent IC device region $220_1$. Likewise, the y-axis boundary of IC device region 210 with the largest x-value may be coplanar with the boundary of the adjacent IC device region $220_2$ or may be coplanar with the boundary of the adjacent IC device region $220_4$.

Contacts $222_1$ (not shown) and contacts $224_1$ are within IC device region $220_1$. Contacts $222_2$ (not shown) and contacts $224_2$ are within IC device region $220_2$. Contacts $222_3$ (not shown) and contacts $224_3$ are within IC device region $220_3$. Contacts $222_4$ (not shown) and contacts $224_4$ are within IC device region $220_4$.

Multiple stiffeners $250_1$-$250_n$ are applied, formed, bonded, connected, or otherwise attached to the BSM surface 204 at least within IC device region 210. Stiffeners $250_1$-$250_n$ are formed of a material with sufficient rigidity or stiffness to locally resist resin layer(s) curvature within at least IC device region 210. Stiffeners $250_1$-$250_n$ may be formed of the same or different materials that have the same or substantially similar CTE relative to the carrier 200. In some embodiments, the stiffeners $250_1$-$250_n$ may all be metal bars, or the like.

A series of stiffeners generally between or associated with a first group consisting of IC device region $220_1$ and IC device region $220_3$ and a second group consisting of IC device region $220_2$ and IC device region $220_4$ may be, for example, steel bars with a x-dimension of 2 millimeters, a z-dimension of 0.5 millimeters, and a y-dimension of 1.5 millimeters. Another series of stiffeners generally between or associated with a third group consisting of IC device region $220_1$ and IC device region $220_3$ and a fourth group consisting of IC device region $220_3$ and IC device region $220_4$ may be, for example, steel bars with a y-dimension of 2 millimeters, a z-dimension of 0.5 millimeters, and a x-dimension of 1.5 millimeters. There may be e.g., a 0.5 mm gap between each stiffener $250_1$-$250_n$.

Each stiffener $250_1$-$250_n$ may be connected to carrier 200 by an adhesive 260, shown e.g., in FIG. 7. Each stiffener $250_1$-$250_n$ adds rigidity or stiffness to IC device region 210 to effectively resist local strain forces that would otherwise be exerted upon the resin layer(s) material in IC device region 210 within the carrier 200. As such, the stiffeners $250_1$-$250_n$ mitigates the risks of cracking and/or crack propagation within the resin layer(s) in IC device region(s) 210.

In one example, each stiffener $250_1$-$250_n$ dimensions are configured so that each stiffener $250_1$-$250_n$ lays entirely within the IC device region 210. In another example, each stiffener $250_1$-$250_n$ dimensions are configured such that each stiffener $250_1$-$250_n$ lays within the IC device region 210 and extends into one or both adjacent IC device regions 220. In another example, the stiffeners 250 nearest the x-axis and/or y-axis boundaries of IC device region 210 lays within the IC device region 210 and extends beyond the x-axis and/or y-axis boundaries of IC device region 210, respectively (i.e., the stiffener nearest the left side of the page lays within the IC device region 210 and extends beyond the left y-axis boundary of IC device region 210, the stiffener nearest the right side of the page lays within the IC device region 210 and extends beyond the right y-axis boundary of IC device region 210, the stiffener nearest the top side of the page lays within the IC device region 210 and extends beyond the x-axis boundary nearest to the top of the page of IC device region 210, and the stiffener nearest the bottom side of the page lays within the IC device region 210 and extends beyond the x-axis boundary nearest to the bottom of the page of IC device region 210).

Though the multiple stiffeners $250_1$-$250_n$ may be shown in different relative orientations in the figures, the multiple stiffeners $250_1$-$250_n$ may have the same orientation.

FIG. 7 depicts a cross section view of IC device carrier 324, according to one or more embodiments of the present invention. Carrier 324, which may also be referred to as a package, module, or the like, includes multiple IC devices 302, carrier 200, interconnects 222, underfill 310, thermal interface material 312, lid 316, adhesive 320, and one or more stiffeners 250 connected to the BSM surface 204 of carrier 200.

IC device 302 may be an IC chip, semiconductor die, processor, microchip, field programmable gate array, ASIC, co-processor, or the like.

Carrier 200 is an organic carrier and provides mechanical and electrical support for multiple IC devices 302, such as the depicted IC device $302_a$ and IC device $302_b$. As such, carrier 200 includes multiple IC device regions 220, depicted in FIG. 7 as $220_a$ and $220_b$. IC device region $220_a$ may be one of the exemplary IC device regions $220_1$, $220_2$, $220_3$, or $220_4$. IC device region $220_b$ may be one of a different and adjacent or neighboring exemplary IC device regions $220_1$, $220_2$, $220_3$, or $220_4$ that is separated from IC device region $220_a$ by IC device region 210.

The z-axis boundary of IC device region $220_a$ with the smallest x-value may be coplanar with the z-axis side surface of the associated IC devices $302_a$ that is nearest the left side of the page and the z-axis boundary of IC device region $220_a$ with the largest x-value may be coplanar with the z-axis side surface of the associated IC devices $302_a$ that is nearest the right side of the page. Likewise, the z-axis boundary of IC device region $220_b$ with the smallest x-value may be coplanar with the z-axis side surface of the associated IC devices $302_b$ that is nearest the left side of the page and the z-axis boundary of IC device region $220_b$ with the largest x-value may be coplanar with the z-axis side surface of the associated IC devices $302_b$ that is nearest the right side of the page. In other words, each region $220_a$ and $220_b$ are a projection or footprint of the perimeter of the associated IC device $302_a$ or $302_b$, respectively, through the IC device carrier 200. Intermediary regions 210 exist between the different IC device regions $220_a$ and $220_b$ through the IC device carrier 200.

Electrically conductive contacts $222_a$ exist within each IC device region $220_a$ upon the TSM surface 202. Electrically conductive contacts $222_b$ exist within each IC device region $220_b$ upon the TSM surface 202. Similarly, electrically conductive contacts $224_a$ exist within each IC device region $220_a$ and electrically conductive contacts $224_b$ exist within each IC device region $220_b$ upon the BSM surface 204. The contacts $224_a$ and $224_b$ have a larger contact pad surface area relative to the contact pad surface area of contacts $222_a$ and $222_b$. One or more conductive wiring lines fabricated within the carrier 200 may be connected to a contact 222 and to a contact 224 within the same IC device region 220, as is known in the art. Such features provide electrical paths from the TSM surface 202 of carrier 200 to the opposing BSM surface 204 of carrier 200.

Each contact $222_a$ is in electrical communication with a contact of the associated IC device $302_a$ by way of an interconnect $322_a$. Likewise, each contact $222_b$ is in electrical communication with a contact of the associated IC device $302_b$ by way of an interconnect $322_b$. Contacts $224_a$ and $224_b$ are configured to be in electrical communication with a higher level data handling system contact, such as a system board contact, motherboard contact, or the like.

Interconnects $322_a$ electrically connect IC device $302_a$ and the TSM surface 202 of carrier 200 and may be a wire bond, solder bond, stud, conductive ball, conductive button, and the like. Interconnects $322_b$ electrically connect IC device $302_b$ and the TSM surface 202 of carrier 200 and may be a wire bond, solder bond, stud, conductive ball, conductive button, and the like.

Underfill $310_a$ may be electrically-insulating, may substantially surround interconnects $322_a$, may isolate individual interconnects $322_a$, and may provide mechanical support between IC device $302_a$ and carrier 200. Underfill $310_a$ may also prevent damage to individual interconnects $322_a$ due to potential CTE mismatches between IC device $302_a$ and carrier 200. Underfill $310_b$ may be electrically-insulating, may substantially surround interconnects $322_b$, may isolate individual interconnects $322_b$, and may provide mechanical support between IC device $302_b$ and carrier 200. Underfill $310_b$ may also prevent damage to individual interconnects $322_b$ due to potential CTE mismatches between IC device $302_b$ and carrier 200.

When IC device $302_a$ and IC device $302_b$ are seated upon carrier 200, a reflow process may be performed to join interconnects 322 to the associated electrical contacts IC device $302_a$ or IC device $302_b$ and contacts $222_a$ or $222_b$ of carrier 200, respectively. After IC device $302_a$ and IC device $302_b$ are seated to carrier 200, lid 316 may be attached to carrier 200 with adhesive 320 and is attached to IC device $302_a$ and IC device $302_b$ by thermal interface material $312_a$, $312_b$, respectively. Generally, during data handling operations conducted by IC device $302_a$ and IC device $302_b$, heat is removed from IC device $302_a$ and IC device $302_b$ through e.g., lid 316 and into a cooler system or component (not shown).

One or more stiffeners 250 are applied, formed, bonded, connected, or otherwise attached to the BSM surface 204 by adhesive 260 at least within IC device region 210 of carrier 200. Stiffener 250 and/or adhesive 260 may be formed of a material that has the same or substantially similar CTE relative to the carrier 200. In some embodiments, the stiffener 250 may be a metal bar, or the like. The stiffener(s) 250 may lay entirely within the boundary of region 210. In other implementations, such as that depicted in FIG. 7, the stiffener(s) 250 may be connected to BSM surface 204 substantially within region 210 and may also extend into the adjacent or neighboring IC device region(s) 220. For example, the majority of the stiffener(s) 250 may be positioned within region 210, the left z-axis side surface of the stiffener(s) 250 may lay within region $220_a$, and/or the right z-axis side surface of the stiffener(s) 250 may lay within region $220_b$. That is, one sidewall of the stiffener(s) 250 may extend within the footprint of the adjacent IC device $302_a$ and the opposing sidewall of the stiffener(s) 250 may extend within the footprint of the adjacent IC device $302_b$.

FIG. 8A depicts a normal view of an alternative implementation of IC device carrier 200 BSM surface 204 that includes one or more decoupling capacitor stiffener(s) 270. FIG. 8B depicts a cross section view of such IC device carrier 200.

Decoupling capacitor stiffener(s) 270 adds rigidity or stiffness to IC device region(s) 210 to effectively resist local strain forces that would otherwise be exerted upon the resin layer(s) material within the carrier 200 and further provides electrical decoupling of a first electrical subsystem or circuit from a second electrical subsystem or circuit of a system in which package 324 is apart. In other words, in addition to stiffening carrier 200 decoupling capacitor stiffener(s) 270 shunts noise generated by the first electrical subsystem, reducing the effect the noise has on the rest of the system. As such, decoupling capacitor stiffener(s) 270 stiffening capabilities mitigates the risks of cracking and/or crack propagation within the resin layer(s) in IC device region(s) 210.

The decoupling capacitor stiffener 270 is applied, formed, bonded, connected, or otherwise attached to the BSM surface 204 within IC device region 210 by adhesive 260. The decoupling capacitor stiffener 270 is further connected or otherwise attached to the BSM surface 204 by one or more interconnects 323, with each connecting a contact 225 of carrier 200 to the decoupling capacitor stiffener 270. For example, interconnect $323_a$ connects contact $225_a$ of carrier 200 to the decoupling capacitor stiffener 270, interconnect $323_b$ connects contact $225_b$ of carrier 200 to the decoupling capacitor stiffener 270, etc. Such electrical pathway from carrier 200 to stiffener 270 may transfer power associated current, ground associated current, signal associated current, or the like to allow for the stiffener 270 to shunt noise generated by the first electrical subsystem, as is known in the art.

Decoupling capacitor stiffener(s) 270 is formed, along with capacitor plates, planes, etc., of materials such that the stiffener 270 has enough rigidity or stiffness to locally resist resin layer(s) curvature within at least IC device region 210. Decoupling capacitor stiffener(s) 270 may be formed of materials such that stiffener 270 has the same or substantially similar CTE relative to the carrier 200. Stiffener 270 adds rigidity or stiffness to IC device region(s) 210 to effectively resist local strain forces that would otherwise be exerted upon the resin layer(s) material within the carrier 200. As such, stiffener 270 mitigates the risks of cracking and/or crack propagation within the resin layer(s) in IC device region(s) 210.

The stiffener 270 dimensions may be configured such that stiffener 270 lays entirely within the IC device region 210. In another example, the stiffener 270 dimensions are configured such that stiffener 270 lays within the IC device region 210 and extends in one or more adjacent or neighboring IC device region(s) 220.

Electrically conductive contacts 225 may exist within an IC device region 220 and/or within region 210 upon the TSM surface 202. The contacts 225 may be positioned upon the TSM surface 202 to align with a respective pad of the stiffener 270 that is electrically connected to one or more capacitor plates or planes there within. The contacts 225 may have the same or substantially similar contact pad surface area relative to the contact pad surface area of contacts 222. One or more conductive wiring lines fabricated within the carrier 200 may be connected to a contact 225. Such features provide an electrical path(s) from the TSM surface 202 of carrier 200 to one or more capacitor plates of stiffener 270. Interconnect 323 electrically connect the BSM surface 204 of carrier 200 with stiffener 270 and may be a wire bond, solder bond, stud, conductive ball, conductive button, and the like. Interconnect 323 may have the same or substantially similar size or volume relative to interconnect 222. When stiffener 270 is seated upon carrier 200, a reflow process may be performed to join interconnects 323 to electrical contacts of stiffener 270 and contacts 225.

For clarity, decoupling capacitor stiffener 270 may be substituted for stiffener 250 in the present paper and in the associated drawings.

Figure 9:
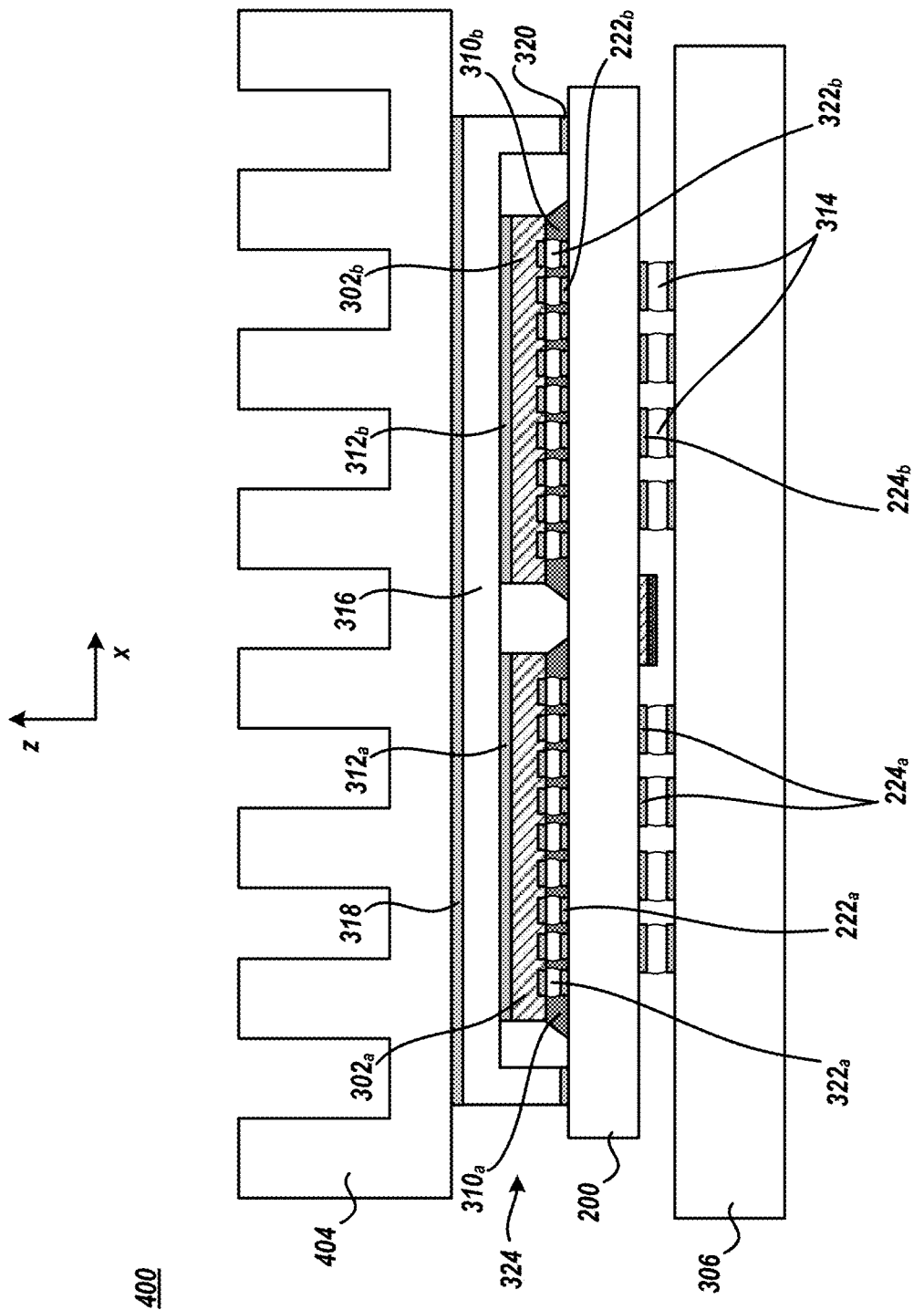
FIG. 9 depicts an electronic system comprising an IC device carrier that utilizes one or more embodiments of the present invention.

FIG. 9 depicts an electronic system 400 comprising an IC device carrier 200 that utilizes stiffener 250 to mitigate resin cracking or propagation in region 210 there within. Electronic system 400 may be for example a computer, server, mobile device, tablet, kiosk, infotainment system, and the like. System 400 includes an IC chip module or package 324 that includes two or more IC devices, two of which ($302_a$ and $302_b$) are shown in the cross section depicted. System 400 also includes carrier 200, interconnects 322, underfill 310, thermal interface material 312, lid 316, and adhesive 320.

Package 324 may be connected to a motherboard 306 via interconnects 314. Motherboard 306 may be the main system board or printed circuit board of electronic device 400, may include electronic components, such as a graphics processing unit, memory, and the like, and provides connectors for other peripherals. Interconnects 314 electrically connect the BSM surface 204 of carrier 200 to motherboard 306 and may be a wire bond, solder bond, stud, conductive ball, conductive button, land grid array (LGA) complaint pins and the like. Interconnects 314 may be larger and thus more robust than interconnects 322. When package 324 is seated upon motherboard 306 a reflow process may be performed to join interconnects 314 to electrical contacts 224 of carrier 200 with respective contacts of motherboard 306. Alternately, a mechanical pressurized interconnect via an intervening socket may be established.

To assist in the removal of heat from the multiple IC devices, a heat sink 304 may be thermally joined to package 324 via thermal interface material 318. Heat sink 304 may be a passive heat exchanger that cools the IC devices by dissipating heat into the surrounding air or may be an active heat exchanger that cools IC devices by dissipating heat into actively cooled circulating fluid. As such, during operation of electronic device 400, a thermal path may exist from IC devices to heat sink 304 through thermal interface material 312, lid 316, and thermal interface material 318, and the like.

Figure 10:
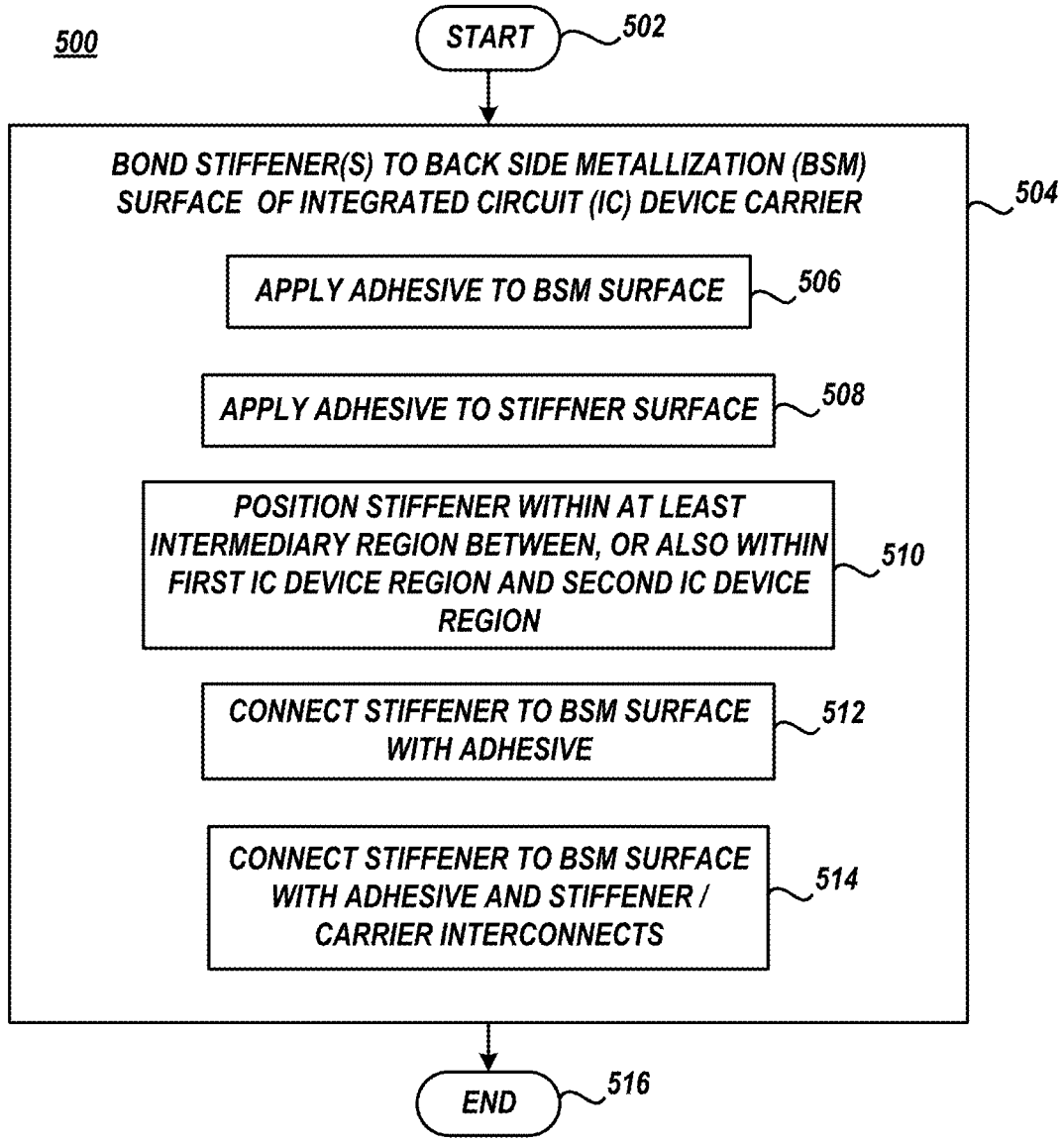
FIG. 10 depicts a method for fabricating an IC device carrier, according to one or more embodiments of the present invention.

FIG. 10 depicts a method 500 for fabricating an IC device carrier 200 comprising a stiffener 250 or stiffener 270. Method 500 begins at block 502 and continues with applying, forming, bonding, connecting, or otherwise attaching the stiffener to the BSM surface 204 at least within region 210 of carrier 200 (block 504). For example, adhesive 260 may be applied to the BSM surface 204 of carrier 200 within the region 210 and/or within region 210 and in one or more adjacent IC device regions 220 (block 506). For example, adhesive 260 may be applied to the stiffener (block 508). The stiffener may be positioned within region 210 that separates and is between adjacent or neighboring IC device regions 220 (block 510). The stiffener may be connected to the carrier 200 BSM surface 204 with the adhesive (block 512). The adhesive may be subsequently heated to cure adhesive 260 to toughen or harden polymer(s) of adhesive 260 by cross-linking of polymer chains. In certain embodiments, stiffener 270 may be further connected to carrier 200 by connecting an interconnect 323 to a contact 225 on the BSM surface 204 of carrier with a contact of the stiffener 270 (block 514). The stiffener(s) adds rigidity or stiffness to IC device region 210 to effectively resist local strain forces that would otherwise be exerted upon the resin layer(s) material in IC device region 210 within the carrier 200. The strain forces may be caused by e.g., thermal cycling (i.e. operation of e.g. system 400). As such, the stiffener mitigates the risks of cracking and/or crack propagation within the resin layer(s) in IC device region(s) 210 of carrier 200.

In addition to mitigating the risks of cracking and/or crack propagation within the resin layer(s) in IC device region(s) 210 of carrier 200 locally near the BSM surface 204, the stiffener(s) may also reduce or absorb strain forces that would otherwise be exerted upon the resin layer(s) material in IC device region 210 within the carrier 200 locally near the TSM surface 202, though the stiffener(s) will absorb more of the strain forces that would otherwise be exerted upon the resin layer(s) material in IC device region 210 within the carrier 200 locally near the BSM surface 204. Even further, the stiffener(s) may also reduce peeling forces that would otherwise cause thermal interface material 312 to peel away from the associated IC device 302.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 200, regardless of the actual spatial orientation of the carrier 200. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A method to mitigate resin cracking within a multi IC device carrier comprising:
   providing a multi IC device carrier comprising a top side metallization (TSM) surface that is connected to a first IC device and to a second IC device, a bottom side metallization (BSM) surface, a first IC device region underneath the first IC device through the multi IC device carrier, a second IC device region underneath the second IC device through the multi IC device carrier, an intermediary region through the multi IC device carrier between and neighboring both the first IC device region and the second IC device region; and a perimeter region through the multi IC device carrier and around a circumference of a group comprising the first IC device region, the second IC device region, and the intermediary region;
   connecting a stiffener to the BSM surface, the stiffener positioned within the intermediary region; and
   resisting, with the stiffener, strain internal to the multi IC device carrier.

2. The method of claim 1, wherein the stiffener positioned within the intermediary region and extends into both the first IC device region and the second IC device region.

3. The method of claim 1, wherein the stiffener is positioned within the intermediary region and extends into the first IC device region, the second IC device region, and the perimeter region.

4. The method of claim 1, wherein the stiffener is positioned within the intermediary region, extends into the perimeter region such that a front side surface of the stiffener is within the intermediary region, and extends into the perimeter region such that a rear side surface of the stiffener is within the intermediary region.

5. The method of claim 1, wherein the stiffener positioned within the intermediary region and extends into the first IC device region such that a first single side surface that connects the front side surface and the rear side surface is within the first IC region and extends into the second IC device region such that a second single side surface that connects the front side surface and the rear side surface is within the second IC region.

6. The method of claim 1, wherein connecting the stiffener to the BSM surface comprises:
   applying adhesive to the BSM surface; and
   connecting the stiffener directly to the adhesive.

7. The method of claim 1, wherein connecting the stiffener to the BSM surface comprises:
   applying adhesive to the stiffener; and
   connecting the adhesive directly to the BSM surface.

8. The method of claim 1, wherein the stiffener resists relatively more stain internal to the multi IC device carrier nearest the BSM surface.

9. The method of claim 1, wherein the stiffener is a solid metal bar.

10. The method of claim 1, wherein the stiffener is a decoupling capacitor stiffener.

11. The method of claim 10, wherein connecting the stiffener to the BSM surface comprises:
electrically connecting a first contact upon the BSM surface with the decoupling capacitor stiffener.

12. The method of claim 11, wherein the first contact is within both the first IC device region and within the intermediary region.

13. The method of claim 1, wherein the first IC device and the second IC device is electrically connected to the TSM surface.

14. A method to fabricate a multi IC device carrier, the method comprising:
electrically connecting a first IC device to a top side metallization (TSM) surface of the multi device carrier;
electrically connecting a second IC device to the TSM surface of the multi device carrier;
the multi IC device carrier comprising the TSM surface, a bottom side metallization (BSM) surface, a first IC device region underneath the first IC device through the multi IC device carrier, a second IC device region underneath the second IC device through the multi IC device carrier, an intermediary region through the multi IC device carrier between and neighboring both the first IC device region and the second IC device region; and a perimeter region through the multi IC device carrier and around a circumference of a group comprising the first IC device region, the second IC device region, and the intermediary region; and
connecting a stiffener to the BSM surface, the stiffener positioned within the intermediary region.

15. The method of claim 14, wherein the stiffener positioned within the intermediary region and extends into both the first IC device region and the second IC device region.

16. The method of claim 14, wherein the stiffener is positioned within the intermediary region and extends into the first IC device region, the second IC device region, and the perimeter region.

17. The method of claim 14, wherein the stiffener is positioned within the intermediary region, extends into the perimeter region such that a front side surface of the stiffener is within the intermediary region, and extends into the perimeter region such that a rear side surface of the stiffener is within the intermediary region.

18. The method of claim 14, wherein the stiffener positioned within the intermediary region and extends into the first IC device region such that a first single side surface that connects the front side surface and the rear side surface is within the first IC region and extends into the second IC device region such that a second single side surface that connects the front side surface and the rear side surface is within the second IC region.

19. The method of claim 14, wherein connecting the stiffener to the BSM surface comprises:
applying adhesive to the BSM surface; and
connecting the stiffener directly to the adhesive.

20. The method of claim 14, wherein connecting the stiffener to the BSM surface comprises:
applying adhesive to the stiffener; and
connecting the adhesive directly to the BSM surface.

* * * * *